(12) United States Patent
Ku

(10) Patent No.: US 7,755,392 B1
(45) Date of Patent: Jul. 13, 2010

(54) LEVEL SHIFT CIRCUIT WITHOUT HIGH VOLTAGE STRESS OF TRANSISTORS AND OPERATING AT LOW VOLTAGES

(75) Inventor: Wei-Ming Ku, Taipei County (TW)

(73) Assignee: eMemory Technology Inc., Science Park, Hsinchu (TW)

( * ) Notice: Subject to any disclaimer, the term of this patent is extended or adjusted under 35 U.S.C. 154(b) by 0 days.

(21) Appl. No.: 12/469,693

(22) Filed: May 21, 2009

(51) Int. Cl.
*H03K 19/0175* (2006.01)
*H03K 19/094* (2006.01)

(52) U.S. Cl. .......................... 326/68; 327/333; 326/81

(58) Field of Classification Search ............. 326/68–87, 326/33; 327/333
See application file for complete search history.

(56) References Cited

U.S. PATENT DOCUMENTS

| | | | | |
|---|---|---|---|---|
| 5,539,334 A | * | 7/1996 | Clapp et al. | 326/68 |
| 5,917,358 A | * | 6/1999 | Sanchez et al. | 327/333 |
| 5,969,542 A | * | 10/1999 | Maley et al. | 326/81 |
| 6,040,708 A | * | 3/2000 | Blake et al. | 326/33 |
| 6,064,227 A | * | 5/2000 | Saito | 326/68 |
| 6,580,307 B1 | | 6/2003 | Chiue | |
| 6,642,769 B1 | | 11/2003 | Chang | |
| 6,906,552 B2 | * | 6/2005 | Ajit | 326/81 |
| 7,145,364 B2 | * | 12/2006 | Bhattacharya et al. | 326/68 |
| 2005/0134355 A1 | * | 6/2005 | Maede et al. | 327/333 |
| 2008/0238522 A1 | * | 10/2008 | Thorp et al. | 327/333 |

* cited by examiner

*Primary Examiner*—Vibol Tan
*Assistant Examiner*—Crystal L Hammond
(74) *Attorney, Agent, or Firm*—Winston Hsu

(57) ABSTRACT

A level shift circuit includes a high voltage circuit, a clamp circuit, an input circuit, and a bypass circuit. The high voltage circuit is electrically connected to a high voltage terminal. The clamp circuit can prevent the transistors of the high voltage circuit from high voltage stress when a voltage level of the high voltage terminal is greater than a voltage level of a voltage source. The bypass circuit is used to bypass the clamp circuit when a voltage level of the high voltage terminal is smaller than a voltage level of transistor breakdown voltages.

10 Claims, 5 Drawing Sheets

LEVEL SHIFT CIRCUIT WITHOUT HIGH VOLTAGE STRESS OF TRANSISTORS AND OPERATING AT LOW VOLTAGES

BACKGROUND OF THE INVENTION

1. Field of the Invention

The present invention relates to a level shift circuit, and more particularly, to a Level shift circuit without high voltage stress of transistors and operating at low voltages.

2. Description of the Prior Art

Please refer to FIG. 1. FIG. 1 is a circuitry of a level shift circuit 10 according to the prior art. The level shift circuit 10 includes two PMOS transistors P1 and P2, and two NMOS transistors N1 and N2. A gate of the transistor N2 is electrically connected to a voltage source Vdd. A source of the transistor P2 and a source of the transistor P1 are electrically connected to a high voltage terminal Vn. An input voltage Vin ranges between a high level voltage (the voltage Vdd) and a low level voltage (a ground voltage).

Assumed the high voltage Vn is 10 volts and the voltage Vdd is 3.3 volts, and the breakdown voltage level of each of the transistors P1, P2, N1 and N2 is 10 volts. When the input voltage Vin is at the high level voltage, the transistor N1 is turned on and the transistor N2 is turned off. A voltage level at the node A1 approaches to the ground voltage and the transistor P2 is turned on. A voltage level at a node A2 approaches to the high voltage Vn and the transistor P1 is turned off. Thus, the output voltage Vout of the level shift circuit 10 approaches to 0 volts. Although the transistors P2 and N1 are turned on, a reverse voltage across the drains and the gates of both the transistors P2 approaches to 10 volts, which results in a number of breakdown currents appearing in a corresponding oxide layer, destroying the level shift circuit 10.

When the input voltage Vin is at the low level voltage, the transistor N1 is turned off and the transistor N2 is turned on. A voltage level at the node A2 approaches to the low level voltage and the transistor P1 is turned on. A voltage level at the node A1 approaches to the high voltage Vn and the transistor P2 is turned off. Thus, the output voltage Vout of the level shift circuit 10 approaches to 10 volts. Although the transistors N2 and P1 are turned on, a reverse voltage across the drains and the gates of the transistors P1 still approaches to 10 volts, which results in a number of breakdown currents appearing in a corresponding oxide layer destroying the level shift circuit 10. To prevent the transistors P1 and P2 from a breakdown, the level shift circuit 10 has to control the voltage level of the high voltage terminal Vn to guarantee that the transistors P1 and P2 function normally.

U.S. Pat. No. 6,580,307 provides a level shift circuit without junction breakdown of transistors. Please refer to FIG. 2. The circuit 80 includes a plurality of PMOS transistors 86, 88, 90, and 92, and a plurality of NMOS transistors 82, 84, and 94. If a voltage level of the source (the node C) is greater than a sum of a threshold voltage Vt of the transistor 86 and a voltage level of a gate of the transistor 86, the transistor 86 actuates and then the transistor 90 also actuates, which makes a voltage level at a node D approach 10 volts (Vn). The actuated transistor 86 gradually reduces the voltage level at the node C until it is smaller than the sum of the threshold voltage Vt of the transistor 86 and the voltage level of the gate of the transistor 86. Because a voltage level difference between the drain and the gate exceeds 6.6 volts, the transistor 90 will not break down. Likewise, the transistor 88 will not break down either. Because a voltage level at the node D approaches 10 volts, the transistor 92 will actuate and then a voltage level at a node A approaches 10 volts.

On the contrary, if the input voltage Vin is zero, the transistor 82 does not actuate and the transistor 94 actuates, which makes the voltage level at the node A approach zero volts. Because the gate of the transistors 86, 92 are connected to the reference voltage Vk (3.3 volts), both transistors 86, 92 do not actuate, which makes the voltage level at the node A and the voltage level at the node D different. When a voltage level of a source (the node D) of the transistor 92 is greater than a sum of a threshold voltage Vt of the transistor 92 and a voltage level of the gate of the transistor 92, the transistor 92 actuates. The voltage level at the node D approaches to the sum of the threshold voltage of the transistor 92 and the voltage level Vk of the gate of the transistor 92. The actuated transistor 92 actuates the transistor 88 and makes the voltage level at the node C approach 10 volts.

The level shift circuit 80 uses the reference voltage Vk to control actuations of the transistors 86, 92, which is capable of preventing the gate s of the transistors 88, 90 from breaking down. However, when the level shift circuit 80 operates at low voltages, the voltage terminal Vn has to overcome two threshold voltages.

SUMMARY OF THE INVENTION

According to an embodiment of the present invention, a level shift circuit comprises a first PMOS transistor, a second PMOS transistor, a third PMOS transistor, a fourth PMOS transistor, a first NMOS transistor, a second NMOS transistor, a third NMOS transistor, a fifth NMOS transistor, a sixth NMOS transistor, a seventh NMOS transistor, a eighth NMOS transistor. The first PMOS transistor has a gate, a source electrically connected to a high voltage terminal, and a drain. The second PMOS transistor has a gate electrically connected to a drain of the first PMOS transistor, a source electrically connected to the high voltage terminal, and a drain electrically connected to the gate of the first PMOS transistor. The third PMOS transistor has a gate electrically connected to a reference voltage terminal, a source electrically connected to the drain of the first PMOS transistor, and a drain. The fourth PMOS transistor has a gate electrically connected to the reference voltage terminal, a source electrically connected to the drain of the second PMOS transistor, and a drain. The first NMOS transistor has a gate electrically connected to a voltage source, a source, and a drain electrically connected to the drain of the third PMOS transistor. The second NMOS transistor has a gate electrically connected to the voltage source, a source, and a drain electrically connected to the drain of the fourth PMOS transistor. The third NMOS transistor has a gate electrically connected to an input terminal, a source electrically connected to a ground, and a drain electrically connected to the source of the first NMOS transistor. The fifth NMOS transistor has a gate electrically connected to the voltage source, a source, and a drain electrically connected to the source of the third PMOS transistor. The sixth NMOS transistor has a gate electrically connected to a control terminal, a source electrically connected to the source of the first NMOS transistor, and a drain electrically connected to the source of the fifth NMOS transistor. The seventh NMOS transistor has a gate electrically connected to the voltage source, a source, and a drain electrically connected to the source of the fourth PMOS transistor. The eighth NMOS transistor has a gate electrically connected to the control terminal, a source electrically connected to the source of the second NMOS transistor, and a drain electrically connected to the source of the seventh NMOS transistor.

According to another embodiment of the present invention, a level shift circuit comprises a high voltage circuit, a clamp circuit, an input circuit, and a bypass circuit. The high voltage circuit provides a high voltage. The clamp circuit is electrically connected to the high voltage circuit, for preventing transistors of the high voltage from high voltage stress. The input circuit is electrically connected to the clamp circuit, for receiving an input voltage. The bypass circuit is electrically connected between the input circuit and the high voltage circuit, for bypassing the clamp circuit.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
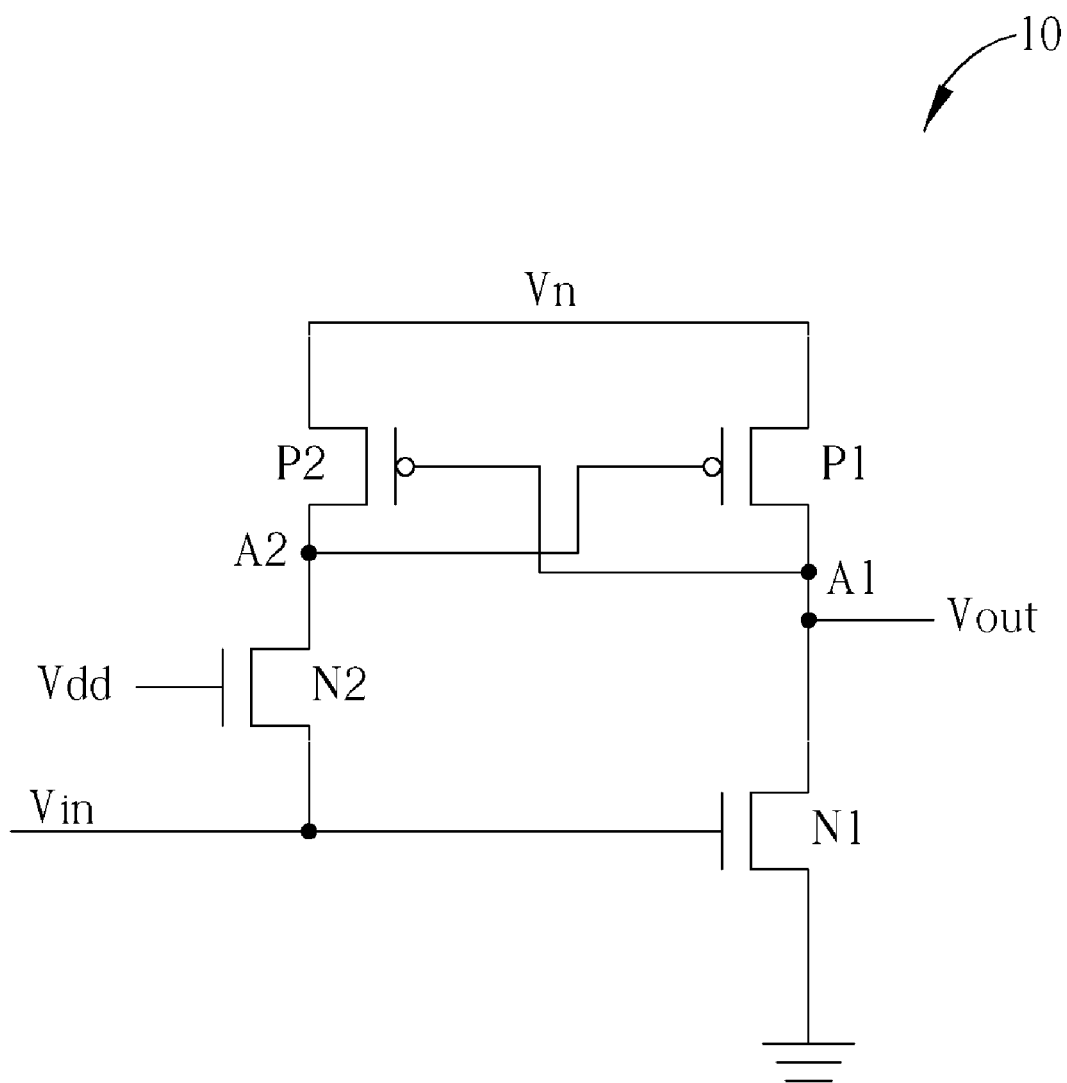
FIG. 1 is a circuitry of a level shift circuit according to the prior art.
Figure 2:
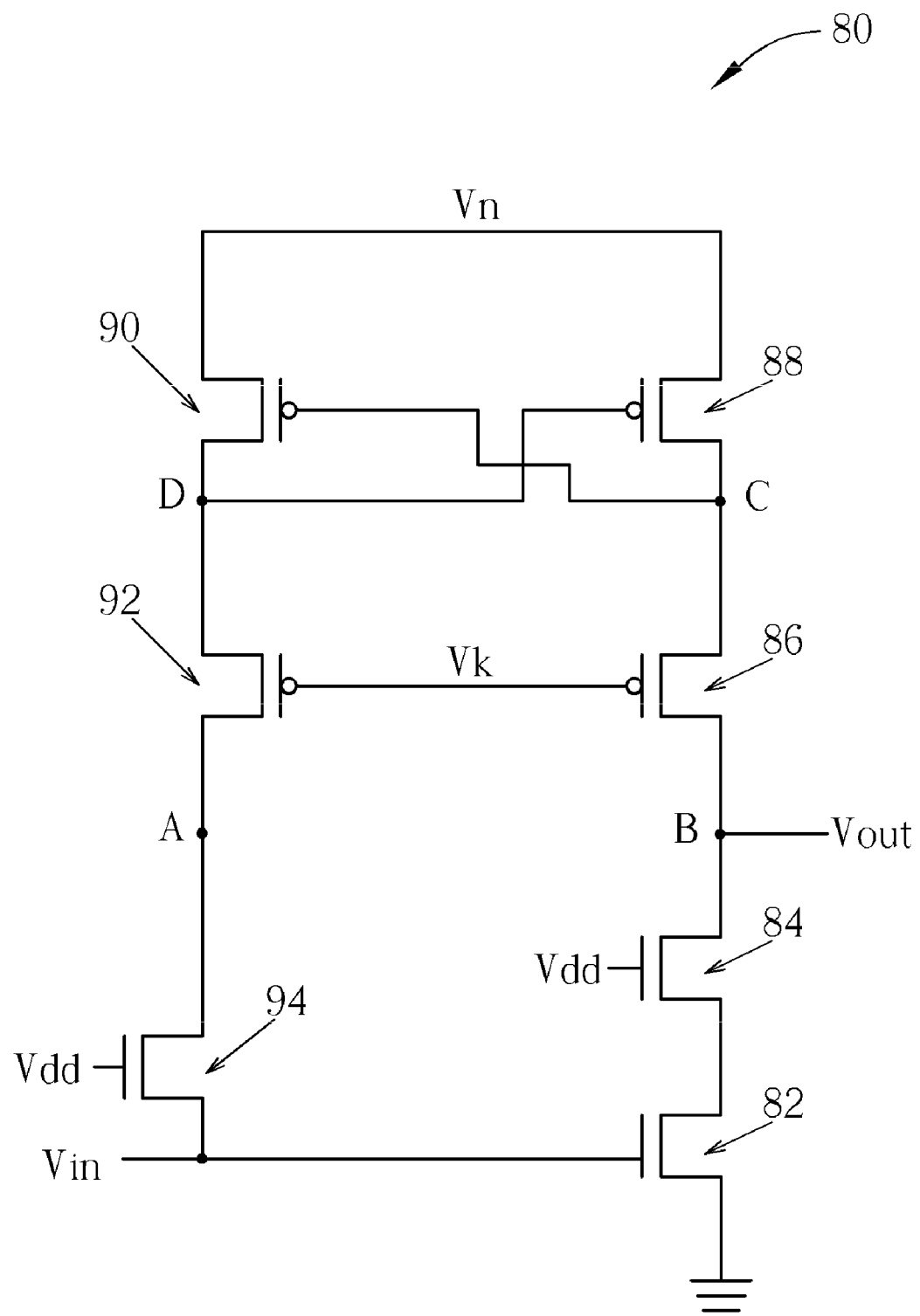
FIG. 2 is a circuitry of a level shift circuit without junction breakdown of transistors according to the prior art.
Figure 3:
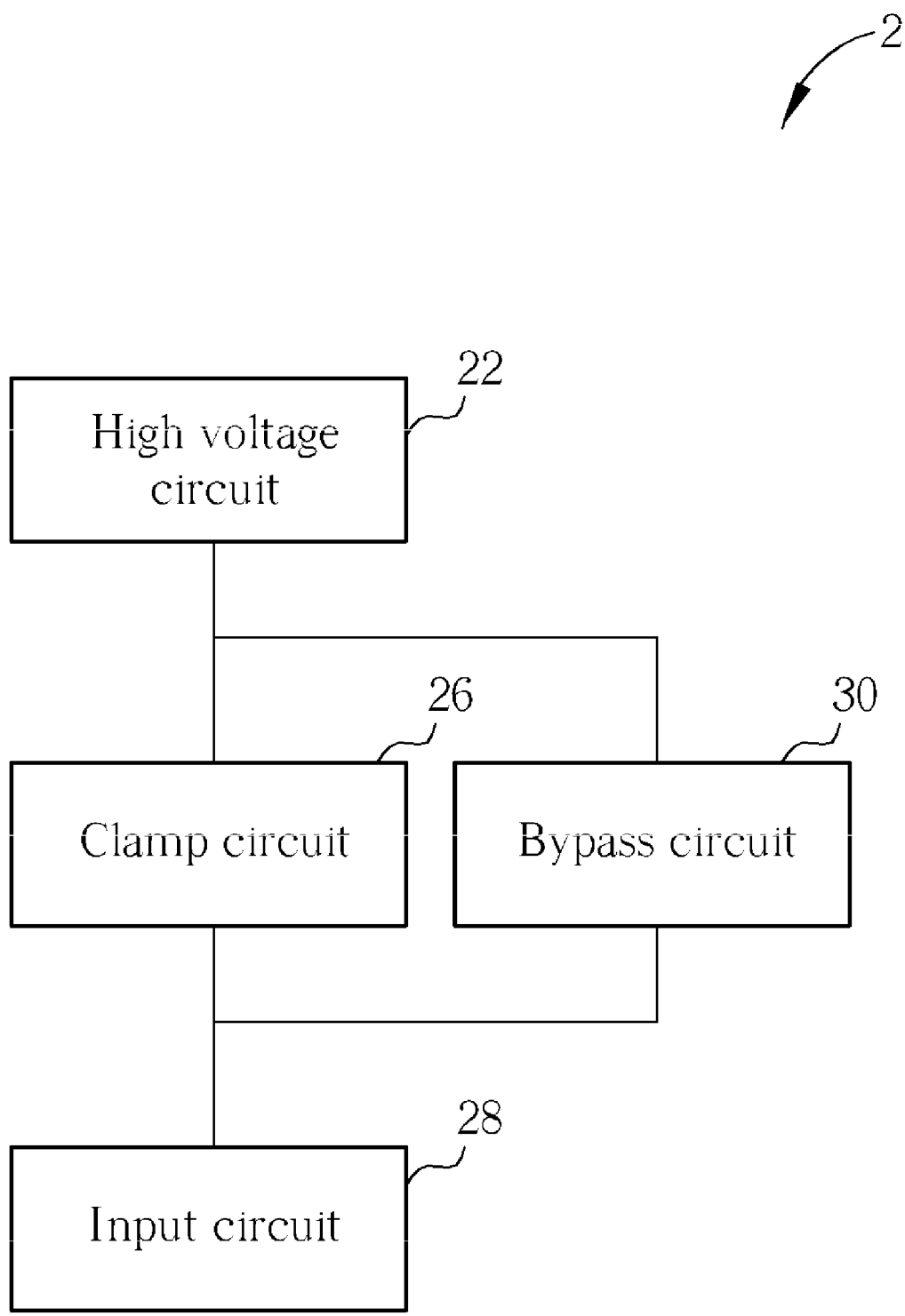
FIG. 3 is a block diagram of a level shift circuit according to the present invention.
Figure 4:
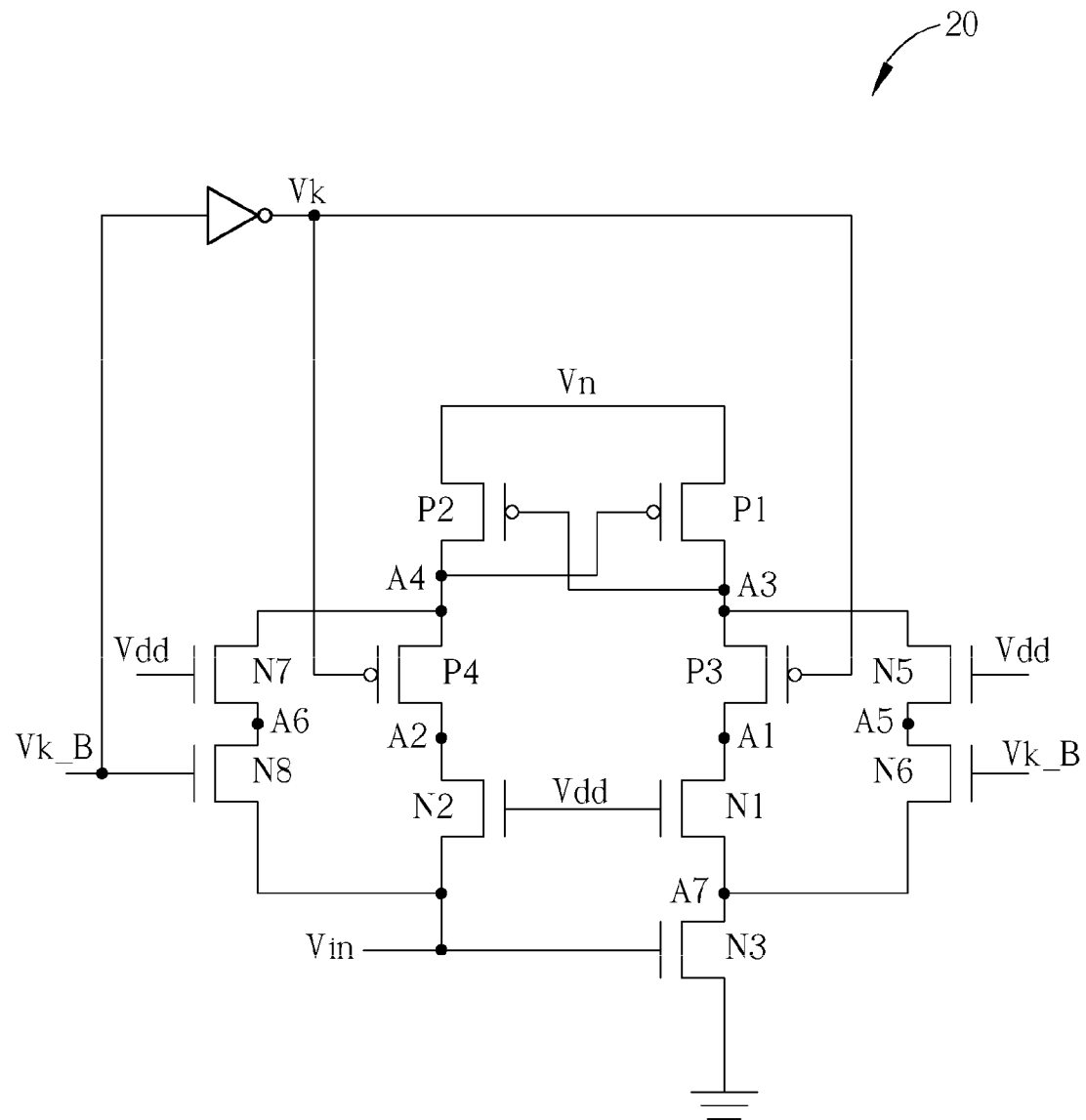
FIG. 4 is a circuitry of a first embodiment of a level shift circuit according to the present invention.

Please refer to FIG. 3 and FIG. 4. FIG. 3 is a block diagram of a level shift circuit 20 according to the present invention. FIG. 4 is a circuitry of a first embodiment of a level shift circuit 20 according to the present invention. The level shift 20 includes a high voltage circuit 22, a clamp circuit 26, an input circuit 28, and a bypass circuit 30. The high voltage circuit 22 includes two PMOS transistors P1 and P2. The clamp circuit 26 includes two PMOS transistors P3 and P4 and two NMOS transistors N1 and N2. The input circuit 28 includes an NMOS transistor N3. The bypass circuit 30 includes four NMOS transistors N5, N6, N7, and N8. The transistors N1 and N2 can prevent the transistor N3 from breakdowns. The transistors P3 and P4 can prevent the transistor P1 and P2 from breakdowns. The sources of the transistors P1 and P2 are electrically connected to a high voltage terminal Vn. The gate of the transistors P1 is electrically connected to the drain of the transistor P2, and the gate of the transistors P2 is electrically connected to the drain of the transistor P1. The gates of the transistors P3 and P4 are electrically connected to a reference voltage terminal Vk. The gates of the transistors N1 and N2 are electrically connected to a voltage source Vdd. An input voltage Vin ranges between the voltage Vdd) and a ground voltage). The clamp circuit 26 can prevent the transistors P1, P2 and N3 of the high voltage circuit 22 and the input circuit 28 from a breakdown when the high voltage Vn is greater than the voltage Vdd. The bypass circuit 30 is used to bypass the clamp circuit 26 when the high voltage Vn is smaller than a sum of a threshold voltage Vtn of the NMOS transistor and a threshold voltage Vtp of the PMOS transistor. The gates of the transistors N5 and N7 are electrically connected to the voltage source Vdd to prevent the transistor N6 and N8 from breakdown voltages. The transistors N6 and N8 are controlled by an inverted reference voltage Vk_B of the reference voltage Vk.

For the condition of the high voltage Vn smaller than the sum of the threshold voltage Vtn and the threshold voltage Vtp, the reference voltage Vk is at a low level voltage. When the input voltage Vin is at the low level voltage, the transistor N3 is turned off and the transistors N2, N8 and N7 are turned on. A voltage level at the node A2 approaches to the low level voltage. A voltage level at the node A4 approaches to the low level voltage and the transistor P1 is turned on. A voltage level at the node A3 approaches to the high voltage Vn and the transistor P3 is turned on. The node A1 is the output end of the level shift 20. Thus, a voltage level at the node A1 approaches to the high voltage Vn. When the input voltage Vin is at the high level voltage, the transistor N3 is turned on. The node A7 approaches to the low level voltage to turn on the transistors N1, N6 and N5. Thus, a voltage level at the node A1 approaches to the low level voltage. A voltage level at the node A3 approaches to the low level voltage and the transistor P2 is turned on. A voltage level at the node A4 approaches to the high voltage Vn and the transistor P4 is turned on. Thus, a voltage level at the node A2 approaches to the high voltage Vn.

For the condition of the high voltage Vn greater than the voltage Vdd, the reference voltage Vk is at a high level voltage. The transistors N6 and N8 are turned off by the inverted reference voltage Vk_B. When the input voltage Vin is at the low level voltage, the transistor N3 is turned off and the transistor N2 is turned on, so a voltage level at the node A2 approaches to the low level voltage. When a voltage level of the source (the node A4) of the transistor P4 is greater than a sum of the threshold voltage Vtp and the reference voltage Vk, the transistor P4 is turned on. The voltage level at the node A4 approaches to a voltage level of Vk+Vtp so as to turn on the transistor P1 until the voltage level of the source of the transistor P4 is smaller than the sum of the threshold voltage Vtp and the reference voltage Vk. A voltage level at the node A3 approaches to the high voltage Vn and the transistor P3 is turned on. Thus, a voltage level at the output node A1 approaches to the high voltage Vn. In addition, the transistor N5 is turned on. The node A5 approaches to a voltage level of Vdd–Vtn, so there are no breakdown voltages across the transistor N5 and N6. In this embodiment, the high level voltage is 3.3 volts, the low level voltage is 0 volts and the high voltage Vn is 10 volts. A voltage level difference between the drain and the gate is 6.6 volts, so the transistor P1 will not break down. Similarly, the transistor P2 will not break down either. When the input voltage Vin is at the high level voltage, the transistor N2 is turned off and the transistor N3 is turned on. The node A7 approaches to the low level voltage to turn on the transistor N1. Thus, the output node A1 approaches the low level voltage. When a voltage level of the source (the node A3) of the transistor P3 is greater than a sum of a threshold voltage Vt and a gate voltage of the transistor P3, the transistor P3 is turned on. The voltage level at the node A3 approaches to the low level voltage so as to turn on the transistor P2 until the voltage level of the source of the transistor P3 is smaller than the sum of the threshold voltage and the gate voltage of the transistor P3. A voltage level of the node A3 approaches to a voltage level of Vk+Vtp and the transistor P2 is turned on. A voltage level at the node A4 approaches to the high voltage Vn and the transistor P4 is turned on. Thus, a voltage level at the node A2 approaches to the high voltage Vn. In addition, the transistor N7 is turned on. The node A6 approaches to a voltage level of Vdd–Vtn, so there are no breakdown voltages across the transistor N7 and N8.

Figure 5:
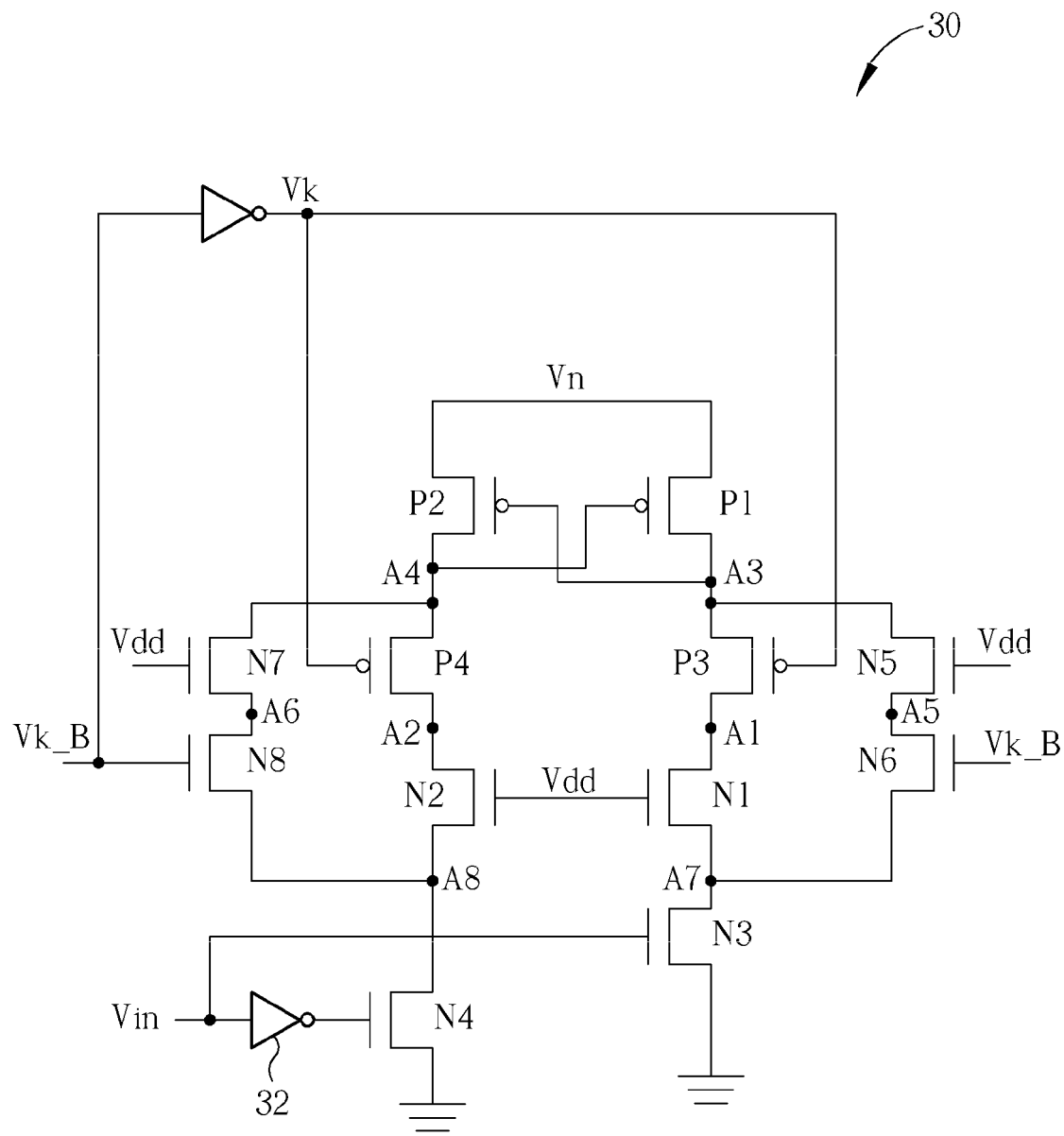
FIG. 5 is a circuitry of a second embodiment of a level shift circuit according to the present invention.

Please refer to FIG. 5. FIG. 5 is a circuitry of a second embodiment of a level shift circuit 30 according to the present invention. In comparison with the first embodiment, the input circuit 28 in the second embodiment includes transistors N3 and N4. In the second embodiment, the input voltage is transmitted to a gate of the transistor N3. In addition, the input voltage is transmitted to a gate of the transistor N4 through an inverter 32. For the condition of the high voltage Vn smaller than the sum of the threshold voltage Vtn and the threshold voltage Vtp, when the input voltage Vin is at the low level voltage, the transistor N3 is turned off and the transistors N4 is turned on. The node A8 approaches to the low level voltage to turn on the transistor N2, N8 and N7. When the input voltage Vin is at the high level voltage, the transistor N3 is turned on and the transistors N4 is turned off. For the condition of the high voltage Vn greater than the voltage Vdd, when the input voltage Vin is at the low level voltage, the transistor N3 is turned off and the transistor N4 is turned on. The transistor N2 is turned on because the transistors N4 is turned on. When the input voltage Vin is at the high level voltage, the transistor N3 is turned on and the transistor N4 is turned off. Thus, the second embodiment has the same operation with the first embodiment. There are no breakdown voltages across any transistors.

In conclusion, the level shift circuit according to the present invention includes a high voltage circuit, a clamp circuit, an input circuit, and a bypass circuit. The high voltage circuit is electrically connected to a high voltage terminal. The clamp circuit can prevent the transistors of the high voltage circuit from high voltage stress when a voltage level of the high voltage terminal is greater than a voltage level of a voltage source. The bypass circuit is used to bypass the clamp circuit when a voltage level of the high voltage terminal is smaller than a voltage level of a sum of a threshold voltage Vtn of the NMOS transistor and a threshold voltage Vtp of the PMOS transistor. Thus, the level shift circuit according to the present invention can prevent high voltage stress of the transistors of the high voltage circuit and can operate at a low voltage.

Those skilled in the art will readily observe that numerous modifications and alterations of the device and method may be made while retaining the teachings of the invention.

What is claimed is:

1. A level shift circuit, comprising:
   a first PMOS transistor having a gate, a source electrically connected to a high voltage terminal, and a drain;
   a second PMOS transistor having a gate electrically connected to a drain of the first PMOS transistor, a source electrically connected to the high voltage terminal, and a drain electrically connected to the gate of the first PMOS transistor;
   a third PMOS transistor having a gate electrically connected to a reference voltage terminal, a source electrically connected to the drain of the first PMOS transistor, and a drain;
   a fourth PMOS transistor having a gate electrically connected to the reference voltage terminal, a source electrically connected to the drain of the second PMOS transistor, and a drain;
   a first NMOS transistor having a gate electrically connected to a voltage source, a source, and a drain electrically connected to the drain of the third PMOS transistor;
   a second NMOS transistor having a gate electrically connected to the voltage source, a source, and a drain electrically connected to the drain of the fourth PMOS transistor;
   a third NMOS transistor having a gate electrically connected to an input terminal, a source electrically connected to a ground, and a drain electrically connected to the source of the first NMOS transistor;
   a fifth NMOS transistor having a gate electrically connected to the voltage source, a source, and a drain electrically connected to the source of the third PMOS transistor;
   a sixth NMOS transistor having a gate electrically connected to a control terminal, a source electrically connected to the source of the first NMOS transistor, and a drain electrically connected to the source of the fifth NMOS transistor;
   a seventh NMOS transistor having a gate electrically connected to the voltage source, a source, and a drain electrically connected to the source of the fourth PMOS transistor; and
   a eighth NMOS transistor having a gate electrically connected to the control terminal, a source electrically connected to the source of the second NMOS transistor, and a drain electrically connected to the source of the seventh NMOS transistor.

2. The level shift circuit of claim 1, further comprising:
   a fourth NMOS transistor having a gate electrically connected to the input terminal through an inverter, a source electrically connected to the ground, and a drain electrically connected to the source of the second NMOS transistor.

3. The level shift circuit of claim 1, wherein a voltage level of the control terminal is complementary to a voltage level of the reference voltage terminal.

4. The level shift circuit of claim 1, wherein when a voltage level of the high voltage terminal is greater than a voltage level of the voltage source, a voltage level of the reference voltage terminal is at a high level voltage.

5. The level shift circuit of claim 1, wherein when a voltage level of the high voltage terminal is smaller than a voltage level of transistor breakdown voltages.

6. A level shift circuit, comprising:
   a high voltage circuit, for providing a high voltage;
   a clamp circuit electrically connected to the high voltage circuit, for preventing transistors of the high voltage circuit from high voltage stress;
   an input circuit, electrically connected to the clamp circuit, for receiving an input voltage; and
   a bypass circuit electrically connected between the input circuit and the high voltage circuit, for bypassing the clamp circuit, the bypass circuit comprising:
      a fifth NMOS transistor having a gate electrically connected to a voltage source, a source, and a drain electrically connected to the clamp circuit;
      a sixth NMOS transistor having a gate electrically connected to a control terminal, a source electrically connected to the input circuit, and a drain electrically connected to the source of the fifth NMOS transistor;
      a seventh NMOS transistor having a gate electrically connected to the voltage source, a source, and a drain electrically connected to the clamp circuit; and
      a eighth NMOS transistor having a gate electrically connected to the control terminal, a source electrically connected to the input circuit, and a drain electrically connected to the source of the seventh NMOS transistor.

7. The level shift circuit of claim 6, wherein the high voltage circuit comprises:
   a first PMOS transistor having a gate, a source electrically connected to a high voltage terminal, and a drain; and
   a second PMOS transistor having a gate electrically connected to a drain of the first PMOS transistor, a source electrically connected to the high voltage terminal, and a drain electrically connected to the gate of the first PMOS transistor.

8. The level shift circuit of claim 6, wherein the clamp circuit comprises:
- a third PMOS transistor having a gate electrically connected to a reference voltage terminal, a source electrically connected to the high voltage circuit, and a drain; and
- a fourth PMOS transistor having a gate electrically connected to the reference voltage terminal, a source electrically connected to the high voltage circuit, and a drain;
- a first NMOS transistor having a gate electrically connected to a voltage source, a source, and a drain electrically connected to the drain of the third PMOS transistor; and
- a second NMOS transistor having a gate electrically connected to the voltage source, a source, and a drain electrically connected to the drain of the fourth PMOS transistor.

9. The level shift circuit of claim 6, wherein the input circuit comprises:
- a third NMOS transistor having a gate electrically connected to an input terminal, a source electrically connected to a ground, and a drain electrically connected to the clamp circuit.

10. The level shift circuit of claim 9, wherein the input circuit further comprises:
- a fourth NMOS transistor having a gate electrically connected to the input terminal through an inverter, a source electrically connected to the ground, and a drain electrically connected to the clamp circuit.

* * * * *